(12) United States Patent
Ulmer et al.

(10) Patent No.: US 7,575,810 B2
(45) Date of Patent: Aug. 18, 2009

(54) REFLECTOR WITH NON-UNIFORM METAL OXIDE LAYER SURFACE

(75) Inventors: Kurt M. Ulmer, Corvallis, OR (US); Terrance A. Tiessen, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 629 days.

(21) Appl. No.: 11/234,439

(22) Filed: Sep. 23, 2005

(65) Prior Publication Data
US 2007/0072409 A1 Mar. 29, 2007

(51) Int. Cl.
*B32B 9/00* (2006.01)
(52) U.S. Cl. .................. 428/469; 216/76; 359/359; 313/113
(58) Field of Classification Search .......... 359/853, 359/883, 884, 359, 360, 361; 313/113; 362/341; 427/160, 162–166; 428/469; 205/205, 118, 205/135, 199, 202, 206, 208, 210, 213, 214, 205/220, 316, 324; 216/24, 72–78
See application file for complete search history.

(56) References Cited

U.S. PATENT DOCUMENTS

| 4,252,843 | A | * | 2/1981 | Dorer et al. ................. 427/162 |
| 4,284,689 | A | * | 8/1981 | Craighead et al. ........... 428/620 |
| 4,396,643 | A | * | 8/1983 | Kuehn et al. ................ 427/160 |
| 4,589,972 | A | | 5/1986 | Pompea et al. |
| 6,441,541 | B1 | | 8/2002 | Tschetter et al. |
| 6,514,621 | B1 | | 2/2003 | Marietti et al. |
| 6,530,668 | B2 | | 3/2003 | Krisko |
| 6,534,903 | B1 | | 3/2003 | Spiro |
| 2001/0044032 | A1 | | 11/2001 | Finley et al. |
| 2002/0110695 | A1 | | 8/2002 | Yang et al. |
| 2003/0052608 | A1 | | 3/2003 | Morimoto et al. |
| 2003/0228484 | A1 | | 12/2003 | Finley et al. |
| 2004/0023038 | A1 | | 2/2004 | Buhay et al. |
| 2004/0023080 | A1 | | 2/2004 | Buhay et al. |
| 2005/0025917 | A1 | | 2/2005 | Laird et al. |
| 2005/0095737 | A1 | | 5/2005 | Edmond et al. |
| 2005/0286024 | A1 | | 12/2005 | Gupta |

FOREIGN PATENT DOCUMENTS

EP          1 522 606 A          4/2005

* cited by examiner

*Primary Examiner*—Alessandro Amari

(57) ABSTRACT

A reflector includes a non-uniform metal oxide layer surface.

34 Claims, 3 Drawing Sheets

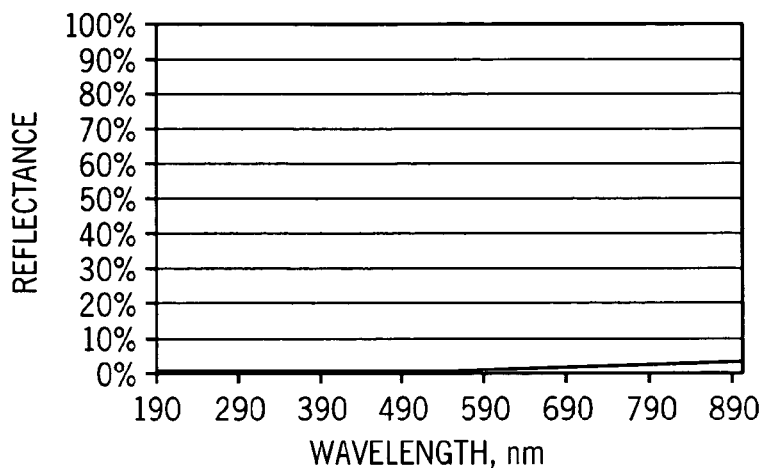
FIG. 9
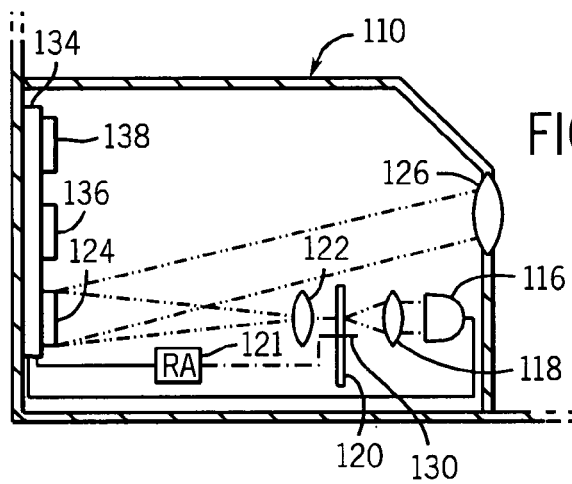
FIG. 10
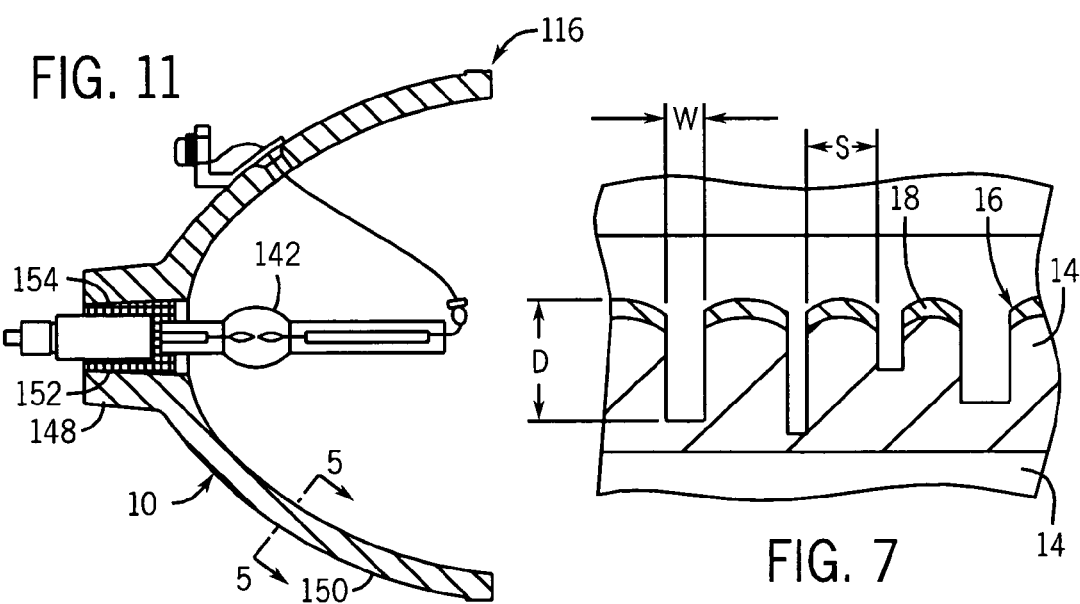
FIG. 11
FIG. 7

REFLECTOR WITH NON-UNIFORM METAL OXIDE LAYER SURFACE

BACKGROUND

Lamps, such as those used in projectors, may include a reflector to reflect and direct light. In some lamps, the reflector may include one or more layers to suppress the reflection of ultraviolet and infrared radiation. Such existing layers may not satisfactorily adhere to underlying layers. Moreover, the composition of such existing layers may not interact well with coatings that may be applied on top of such layers.

BRIEF DESCRIPTION OF THE DRAWINGS

FIG. 7 is an enlarged sectional view schematically illustrating one example of non-uniformed metal oxide layer surface according to one example embodiment.

FIG. 9 is a graph illustrating reflectance of electromagnetic radiation by an absorption layer of the reflector according to one example embodiment.

FIG. 10 is a sectional view schematically illustrating one example embodiment of a projector having a lamp including the reflector of FIG. 5 according to one example embodiment.

FIG. 11 is a sectional view of one example of the lamp of FIG. 7 according to one example embodiment.

DETAILED DESCRIPTION OF EXAMPLE EMBODIMENTS

Figure 1:
FIGS. 1-5 are cross sectional views schematically illustrating one example of a method of forming a reflector according to one example embodiment.
Figure 3:
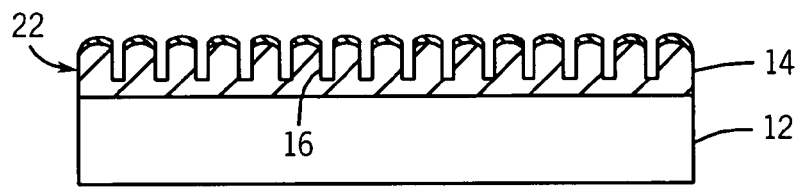
Figure 4:
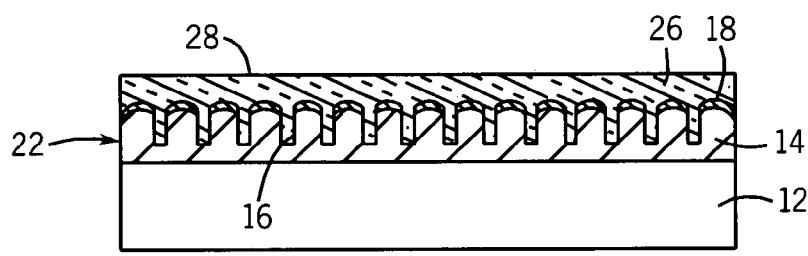
Figure 5:
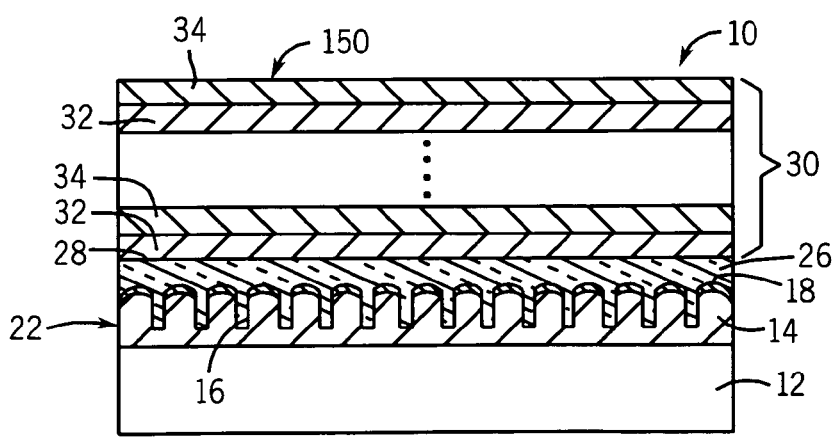

FIGS. 1-5 are cross sectional views schematically illustrating one example of a method for forming a reflector 10 (shown in FIG. 5). As shown by FIG. 1, reflector 10 is formed by providing a substrate 12 and a metal oxide layer 14. Substrate 12 supports metal oxide layer 14. In one embodiment, substrate 12 is formed from a metal, such as aluminum. Because substrate 12 is formed from a metal, such as aluminum, substrate 12 has a high degree of thermal conductivity, providing reflector 10 with beneficial heat dissipation characteristics. Because substrate 12 is formed from a metal, such as aluminum, reflector 10 is lightweight and may have a lower cost as compared to reflectors formed from other materials. In one embodiment substrate 12 may include a diamond turned aluminum or aluminum alloy. In one embodiment the aluminum alloy is an alloy intended for a casting process such as aluminum 380. In other embodiments, substrate 12 may be formed from other materials.

Metal oxide layer 14 constitutes a layer of metal oxide material formed upon substrate 12 and configured to absorb ultraviolet and infrared light. In one embodiment, metal oxide layer 14 is formed by depositing a transition metal onto substrate 12 in an oxygen deficient atmosphere such that the metal oxide layer has a reflectivity of less than or equal to about 10 percent. In one embodiment, metal oxide layer 14 is sputter deposited from an aluminum target in an oxygen-containing atmosphere. According to one embodiment, the oxygen partial pressure is controlled so as to have an atmosphere lacking the oxygen needed to for an amorphous stoichiometric $Al_2O_3$ film. The resulting film is oxygen deficient and is dark or black in appearance so as to have a reflectivity of less than or equal to about 10 percent. In other embodiments, metal oxide layer 14 may be formed and provided on substrate 12 by other methods and may include oxides of other transition metals such as chromium, iron, titanium, nickel and copper.

Figure 2:
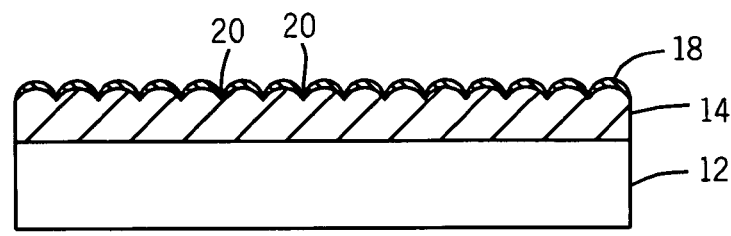

As shown by FIGS. 2 and 3, metal oxide layer 14 is non-uniformly etched to form multiple non-uniform pits, dimples, depressions or pores 16 (shown in FIG. 3) non-uniformly arranged across a surface of metal oxide layer 14. As shown in FIG. 2, according to one embodiment, such non-uniform etching of metal oxide layer 14 may be achieved by applying a mask layer 18 onto metal oxide layer 14 so as to expose non-uniformly spaced portions 20 across or along metal oxide layer 14. Mask layer 18 permits some portions of metal oxide layer 14 to be etched while other portions of metal oxide layer 14 remain unetched. Mask layer 18 facilitates such non-uniform etching of metal oxide layer 14.

Figure 6:
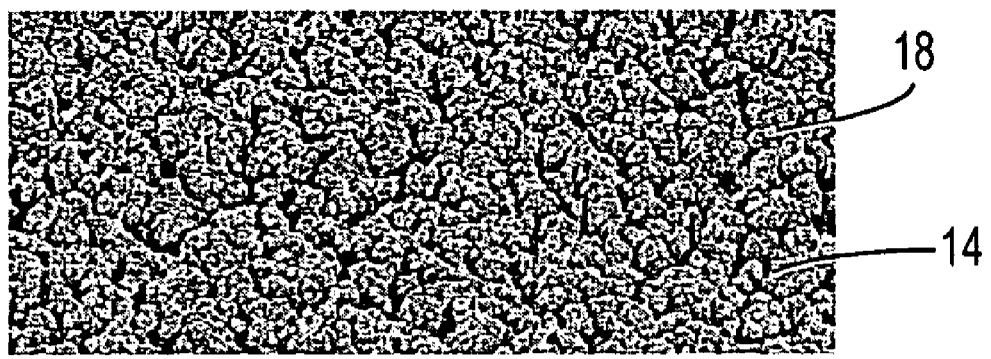
FIG. 6 is an optical micrograph of one embodiment of a metal oxide layer prior to etching according to one example embodiment.

According to one embodiment, mask layer 18 is formed by depositing a discontinuous or non-uniform film of one or more materials resistant to an etchant upon metal oxide layer 14. In one embodiment, mask layer 18 is formed by sputter depositing a gold material across metal oxide layer 14, wherein the gold layer is sufficiently thin so as to not form a continuous thin film. In one embodiment in which mask layer 18 is formed by sputter depositing gold onto metal oxide layer 14, mask layer 18 has a thickness of at least about 10 Å, of less than about 100 Å and nominally about 50 Å. In other embodiments, mask layer 18 may be formed from other materials, may be deposited upon metal oxide layer 14 in other fashions and may have alternative thicknesses. FIG. 6 is an optical micrograph of one example in which 50 Å of gold are sputter deposited upon a metal oxide layer constituting oxygen deficient $AL_2O_3$.

FIG. 3 illustrates subsequent etching of metal oxide layer 14 to form pores 16. As shown by FIG. 3, an etchant is applied on masking layer 18, wherein the etchant etches away or removes exposed portions 20 of metal oxide layer 14 through mask 18. As shown by FIG. 7 which is enlarged view of FIG. 3, pores 16 have non-uniform widths W, non-uniform depths D, and non-uniform distribution or spacings S across layer 14. The resulting etched metal oxide layer 14 provides an ultraviolet and infrared light absorption layer 22 upon substrate 12 which decreases or suppresses specular reflection.

In one embodiment, the etching is performed such that the surface of metal oxide layer 14 has a highly porous non-uniform profile. In one embodiment, pores 16 may have a depth dimension of about 1 micrometer. In one embodiment, the etched metal oxide has a surface roughness of at least 0.1 micrometers and less than about 1 micrometer. It has been found that this surface roughness enhances absorption of ultraviolet and infrared light.

Figure 8:
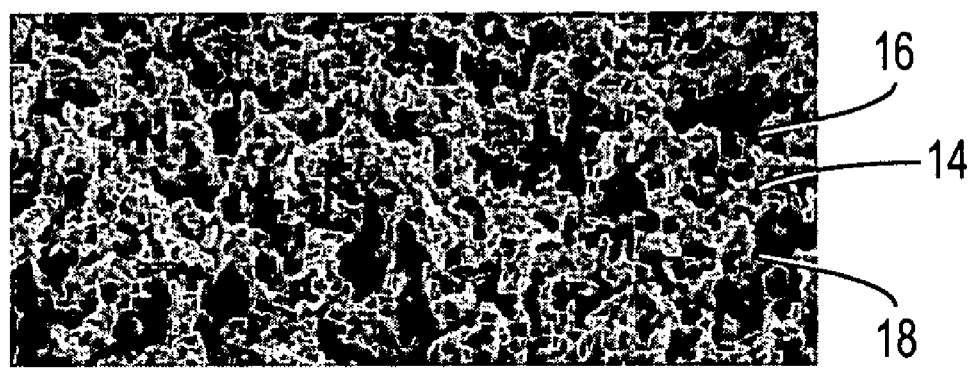
FIG. 8 is an optical micrograph of one example of the non-uniformed metal oxide layer surface of FIG. 7 according to one example embodiment.

According to one example embodiment in which masking layer includes an approximately 50 Å gold film non-uniformly applied across metal oxide layer 14, metal oxide layer 14 is etched for approximately 2 minutes in a 0.1M NaOH solution. FIG. 8 is an optical micrograph of one example of a metal oxide layer, such as oxygen deficient $AL_2O_3$, upon which 50 Å of gold have been sputter deposited and after etching for approximately 2 minutes in 0.1M NaOH solution. As shown in FIG. 8, pores 16 have a non-uniform depths D, widths W and spacing S across layer 14. Moreover, pores 16 have non-uniform shapes. The etch is time controlled to obtain desired optical characteristics as under and over-etching may result in poor optical performance. In other embodiments, other etchants may be used to form a nanopore structure along the surface of metal oxide layer 14 so as to suppress optical reflection. In yet other embodiments the wet etch process as in the example embodiment may be replaced by a vapor or a plasma dry etch process. The resulting morphology from a dry etch process would be different from that of a wet etch process.

As shown in FIG. 4, a de-coupling or interface layer 26 is subsequently applied upon light absorption layer 22. Interface layer 26 is configured to transmit ultraviolet light and infra-red light to absorption layer 22 for absorption while also providing a relatively smoother surface 28 against which multi-layer optical coating 30 may be deposited, formed or otherwise coupled to layer 22. In the embodiment illustrated, interface layer 26 backfills each of the pores 16 to provide surface 28 which is relatively smoother than light absorption layer 22. In other embodiments, layer 26 may extend over pores 16.

In the particular example illustrated, interface layer 26 further has appropriate optical properties such as an appropriate refractive index and extinction co-efficient. In particular, interface layer 26 has a refractive index of less than or equal to about 1.55 greater than or equal to about 1.35 and nominally about 1.5. Interface layer 26 further has an extinction co-efficient near 0. In other embodiments, interface layer 26 may have other properties.

According to one embodiment, interface layer 26 is formed from a dielectric material configured to permit transmission of ultraviolet and infra-red light and having desired optical surface planar characteristics. In one embodiment, interface layer 26 is formed from a spun-on glass material such as methylsiloxane silicate precursor commercially available from Honeywell Electronic Materials Company. After interface layer 26 is deposited upon absorption layer 22, interface layer 26 is subjected to an annealing process in which interface layer 26 is heated at a temperature of approximately 450 degrees Celsius. In other embodiments, other annealing processes or temperatures may be used.

In one embodiments, other materials and deposition processes may be used to form layer 26. Examples of other materials include sodium silicate, tetraethyl orthosilicate (TEOS) ($Si(Oc_2H_h)_4$) or other SOL-GEL compositions derived from silicon alkoxyde, beta-diketonate, or carboxylate precursor materials. In still other embodiments, interface layer 26 may include other materials such as a physical vapor deposition (PVD) or chemical vapor deposition (CVD) deposited silica.

In one embodiment, interface layer 26 has a thickness of at least 2 micrometers, less than or equal to about 10 micrometers and nominally about 5 micrometers. In the example embodiment in which interface 26 is formed from methylsiloxane silicate precursor and has the aforementioned thicknesses, interface 26 is less prone to cracking than other interface or decoupling layer chemistries.

FIG. 6 is a graph illustrating approximate reflectance of the partially completed reflector 10 shown in FIG. 4 after interface layer 26 has been deposited upon absorption layer 22. In particular, FIG. 6 illustrates reflectivity of absorption layer 22 formed from etched aluminum oxide upon an aluminum substrate 12. As shown in FIG. 6, absorption layer 22 substantially suppresses reflection of light having a wavelength from 190 nanometers to 890 nanometers.

As shown by FIG. 5, optical coating 30 is deposited or otherwise formed upon interface layer 26. Optical coating 30 constitutes one or more layers configured to reflect visible light. In the particular embodiment illustrated, optical coating 30 further allows ultraviolet light and infra-red light to pass through optical coating 30 towards absorption layer 22.

In one embodiment, optical coating 30 includes a stack of multiple layers which alternate between a $TiO_2$ layer 32 and a $SiO_2$ layer 34. In one particular embodiment, each layer 32 has a thickness of 20 nanometers to 100 nanometers while each layer 34 has a thickness of about 20 nanometers to 100 nanometers. Reflector 10 includes between 30 and 50 total layers including layers 30 and 32. In other embodiments, optical coating 30 may be formed from one or more other materials, may have other stacked arrangements, may have greater or fewer layers and may have other thicknesses.

Overall, reflector 10 may be formed from less expensive materials and less complex and expensive fabrication processes while providing optical and thermal dissipation benefits. In particular, reflector 10 utilizes substrate 12 formed from a metal such as aluminum that may be inexpensively fabricated and that has thermal dissipation benefits. Absorption layer 22 absorbs ultraviolet and infra-red light while being formed from a metal such as aluminum. Because both substrate 12 and absorption layer 22 are formed from metals and oxides of metals, adhesion between absorption layer 22 and substrate 12 is enhanced. Because both substrate 12 and absorption layer 22 are formed from a common metal, aluminum and aluminum oxide, respectively, adhesion between such layers is further enhanced. Interface layer 26 intercedes between absorption layer 22 and optical coating 30 to provide optical coating 30 with a relatively smooth surface as compared to the surface of absorption layer 22 to enable optical coating 30 to better perform its intended function of reflecting visible light.

FIGS. 7 and 8 schematically illustrate one example embodiment of a projector 110 having a lamp 116 including reflector 10 (shown in FIG. 5). In the particular example illustrated, projector 110 includes a digital light processing (DLP) projector. In addition to lamp 116, projector 110 generally includes optics 118, color wheel 120, rotary actuator 121, optics 122, digital micromirror device (DMD) 124 and projection lens 126. Lamp 116 includes a source of light (burner) such as an ultra high pressure (UHP) arc lamp and reflector configured to emit light toward optics 118. In other embodiments, other sources of light may be used such as metal halide lamps and the like. Optics 118 are generally positioned between lamp 116 and color wheel 120. Optics 118 condenses the light from lamp 116 towards DMD 124. In one embodiment, optics 118 may include a light pipe positioned between lamp 116 and color wheel 120.

Color wheel 120 includes an optic component configured to sequentially image color. Color wheel 120 generally includes a disk or other member having a plurality of distinct filter segments positioned about the rotational axis 130 of the wheel and arranged such that light from optics 118 passes through such filter segments towards DMD 124. In one particular embodiment, color wheel 120 may include circumferentially arranged portions including red, green, blue, and clear. In another embodiment, color wheel 120 may include circumferentially arranged portions or segments corresponding to each of the three primary colors: red, green and blue. In yet another embodiment, color wheel 120 may include multiple segments of each of the primary colors. For example, color wheel 120 may include a first red segment, a first green segment, a first blue segment, a second red segment, a second green segment and a second blue segment. In still other embodiments, color wheel 120 may include other segments configured to filter light from lamp 116 to create other colors.

Rotary actuator 121 includes a device configured to rotatably drive color wheel 120 such that light from lamp 116 sequentially passes through the filter segments. In one embodiment, rotary actuator 121 rotates color wheel 120 at a predetermined substantially constant speed. In another embodiment, rotary actuator 121 may be configured to rotate color wheel 120 at varying speeds based upon control signals received from processor 136. In one embodiment, rotary actuator 121 includes a motor and an appropriate transmission for rotating color wheel 120 at a desired speed. In other embodiments, rotary actuator 121 may include other devices configured to rotatably drive color wheel 120.

Optics 122 includes one or more lenses or mirrors configured to further focus and direct light that has passed through color wheel 120 towards DMD 124. In one embodiment, optics 122 may include lenses which focus and direct the light. In another embodiment, optics 122 may additionally include mirrors which re-direct light onto DMD 124.

In one embodiment, DMD 124 includes a semiconductor chip covered with a multitude of minuscule reflectors or mirrors which may be selectively tilted between "on" positions in which light is re-directed towards lens 126 and "off" positions in which light is not directed towards lens 126. The mirrors are switched "on" and "off" at a high frequency so as to emit a gray scale image. In particular, a mirror that is switched on more frequently reflects a light gray pixel of light while the mirror that is switched off more frequently reflects darker gray pixel of light. In this context "gray scale", "light gray pixel", and "darker gray pixel" refers to the intensity of the luminance component of the light and does not limit the hue and chrominance components of the light. The "on" and "off" states of each mirror are coordinated with colored light from color wheel 120 to project a desired hue of color light towards lens 126. The human eye blends rapidly alternating flashes to see the intended hue of the particular pixel in the image being created. In the particular examples shown, DMD 124 is provided as part of a DLP board 134 which further supports a processor 136 and associated memory 138. Processor 136 and memory 138 are configured to selectively actuate the mirrors of DMD 124. In one embodiment, processor 136 and memory 138 are also configured to control rotary actuator 121. In other embodiments, processor 136 and memory 138 may alternatively be provided by or associated with another (not shown) controller.

Lens 126 receives selected light from DMD 124 and projects the reflected light towards a screen (not shown). Although projector 110 is illustrated and described as a DLP projector, projector 110 may alternatively include other projectors having other components configured such that projector 110 sequentially projects a series of colors towards a screen so as to form a visual image upon the screen.

In yet other embodiments, projector 110 may include other forms of projectors which utilize a light source such as lamp 116. For example, in one embodiment, projector 110 may alternatively include a Fabry-Perot interferometric device configured to reflect different colors or wavelengths of light depending upon a thickness of a selectively adjustable optical cavity. In such an embodiment, color wheel 120 and rotary actuator 121 may also be omitted. In still other embodiments, projector 10 may have other configurations.

FIG. 8 illustrates one example of the lamp 116 in detail. As shown by FIG. 8, lamp 116 includes burner 142 and reflector 10. Burner 142 includes a device configured to emit light to be projected by lamp 116. In one embodiment, burner 142 includes a device configured to emit both visible light, ultraviolet light and infra-red light. In one embodiment, burner 142 includes a high pressure mercury arc lamp. In other embodiments, burner 142 may include other devices configured to emit light including visible light, ultraviolet light and infra-red light, for instance, a high pressure Xeron arc-source.

Reflector 10 includes one or more structures configured to reflect and direct light emitted by burner 142. In the particular embodiment illustrated, reflector 10 generally includes base or hub 148 and bowl 150. Hub 148 includes that portion of reflector 144 to which burner 142 is mounted or supported. In the particular example illustrated, hub 148 includes an opening 152 through which burner 142 extends for connection to an external power source. Opening 152 is sealed about burner 142. In one embodiment, opening 152 is at least partially filled with a cement 154 to seal and connect burner 142 to base 148. In other embodiments, the burner may be sealed or joined to base 148 by other materials or structures.

Bowl 150 includes that portion of reflector 10 configured to surround and reflect the visible light emitted by burner 142. In the particular example illustrated, bowl 150 is a generally ellipsoidal structure configured to surround and direct light emitted by burner 142. In other embodiments, bowl 150 may have any curved or angled shape.

In operation, burner 42 emits a light including visible light, ultraviolet light and infra-red light within the envelope provided by reflector 10. Optical coating 30 of reflector 10 reflects visible light in a directed manner towards a light modulator such as DMD 124 (shown in FIG. 7). Ultraviolet light and infra-red light emitted by burner 142 passes through optical coating 30 and through interface layer 26. The ultraviolet let and infra-red light are absorbed by absorption layer 22 within the envelope or enclosure provided by reflector 10. As noted above, the construction of reflector 10 as well as method of fabrication enable reflector 10 to have an enhanced optical and thermal dissipation characteristics and to be more easily fabricated or formed.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompasses a plurality of such particular elements.

What is claimed is:

1. A method comprising:
   providing a metal oxide layer having a reflectivity of less than or equal to about 10 percent; and
   non-uniformly etching the metal oxide layer.

2. The method of claim 1, wherein providing a metal oxide layer comprises sputter depositing a transition metal onto a substrate in an oxygen deficient atmosphere.

3. The method of claim 1 further comprising forming a non-uniform mask layer on the metal oxide layer prior to etching.

4. The method of claim 3, wherein the mask layer is selected from a group of materials consisting of:
   gold, silver, palladium, platinum, titanium, nickel, and copper.

5. The method of claim 1 further comprising applying an interface layer onto the etched metal oxide layer.

6. The method of claim 5, wherein applying the interface layer comprises spinning an interface layer onto the etched metal oxide layer.

7. The method of claim 6, wherein the interface layer includes material selected from a group of materials consisting of:
spun-on glass,
methylsiloxane silicate, sodium silicate, TEOS, and SOL-GEL material.

8. The method of claim 5 further comprising forming an optical coating on the interface layer.

9. The method of claim 1, wherein the metal oxide is selected from a group of oxides of metals consisting of oxides of:
aluminum, chromium, iron, titanium, nickel and copper.

10. The method of claim 1, wherein the metal oxide is aluminum oxide.

11. The method of claim 10, wherein the metal oxide layer is upon an aluminum substrate.

12. The method of claim 1, wherein the etched metal oxide layer has a surface roughness of at least about 0.1 micrometers.

13. The method of claim 1, wherein the etched metal oxide layer has a surface roughness of less than about 1 micrometer.

14. A method comprising:
providing a metal oxide layer having a reflectivity less than or equal to about 10 percent; and
a step for forming non-uniform pores on a surface of the metal oxide layer; and
completely filling the pores with at least one layer.

15. The method of claim 14, wherein the pores are at least partially filled with an interface layer including material selected from a group of materials consisting of:
spun-on glass,
methylsiloxane silicate, sodium silicate, TEOS, and SOL-GEL material, wherein the interface layer completely fills the pores.

16. The method of claim 15, wherein the interface layer completely fills the pores.

17. The method of claim 16 further comprising forming an optical coating on the interface layer.

18. The method of claim 16, wherein the optical coating is configured to reflect visible light.

19. The method of claim 14, wherein the step for forming non-uniform pores includes forming a masking layer non-uniformly extending across the metal-oxide layer.

20. The method of claim 19 further comprising forming a layer upon and in contact with the metal oxide layer and the masking layer.

21. The method of claim 20, wherein the step for forming non-uniform pores includes etching the metal oxide layer.

22. The method of claim 14, wherein the metal oxide layers provided by sputter depositing a transition metal in an oxygen deficient atmosphere.

23. The method of claim 14, wherein the metal oxide is selected from a group of oxides of metals consisting of oxides of:
aluminum, chromium, iron, titanium, nickel and copper.

24. The method of claim 14, wherein the metal oxide is aluminum oxide and wherein the metal oxide layer is provided upon and in contact with an aluminum substrate.

25. The method of claim 24, wherein the step for forming non-uniform pores includes etching the metal oxide layer.

26. The method of claim 14, wherein the pores are completely filled with an interface layer consisting of spun-on glass.

27. A method comprising:
providing a metal oxide layer having a reflectivity less than or equal to about 10 percent; and
forming non-uniform pores on a surface of the metal oxide layer;
completely filling the pores with an interface layer; and
forming an optical layer on the interface layer.

28. The method of claim 27, wherein the optical layer is configured to reflect visible light.

29. The method of claim 27, wherein forming non-uniform pores includes forming a masking layer non-uniformly extending across the metal-oxide layer.

30. The method of claim 29, wherein the interface layer extends upon and is in contact with the metal oxide layer and the masking layer.

31. The method of claim 27, wherein forming non-uniform pores includes etching the metal oxide layer.

32. The method of claim 27, wherein the metal oxide layer is provided by sputter depositing a transition metal in an oxygen deficient atmosphere.

33. The method of claim 27, wherein the metal oxide is selected from a group of oxides of metals consisting of oxides of:
aluminum, chromium, iron, titanium, nickel and copper.

34. The method of claim 27, wherein the metal oxide is aluminum oxide and wherein the metal oxide layer is provided upon and in contact with an aluminum substrate.

* * * * *